(12) United States Patent
Sakaguchi et al.

(10) Patent No.: US 6,221,738 B1
(45) Date of Patent: Apr. 24, 2001

(54) SUBSTRATE AND PRODUCTION METHOD THEREOF

(75) Inventors: Kiyofumi Sakaguchi, Yokohama; Nobuhiko Sato, Sagamihara, both of (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/046,433

(22) Filed: Mar. 24, 1998

(30) Foreign Application Priority Data

Mar. 26, 1997 (JP) .................................................. 9-073518

(51) Int. Cl.$^7$ .................................................. H01L 21/30
(52) U.S. Cl. .............................. 438/455; 438/458; 216/2; 216/33; 148/33; 117/104
(58) Field of Search .................... 438/406, 409, 438/455, 458; 117/104, 108; 216/2, 33, 36, 55, 56, 99; 148/33; 428/420

(56) References Cited

U.S. PATENT DOCUMENTS

| 4,445,965 | 5/1984 | Milnes ................................. 156/624 |
| 4,816,420 | 3/1989 | Bozler et al. ........................... 438/67 |
| 5,055,383 | 10/1991 | Koblinger et al. .................... 430/312 |
| 5,371,037 | 12/1994 | Yonehara ............................... 438/459 |
| 5,374,564 | * 12/1994 | Bruel .................................... 438/458 |
| 5,439,843 | * 8/1995 | Sakaguchi et al. .................... 438/455 |
| 5,714,395 | * 2/1998 | Bruel .................................... 438/458 |
| 5,811,348 | 9/1998 | Matsushita et al. .................. 438/455 |
| 5,980,633 | * 11/1999 | Yamagata et al. ..................... 117/94 |

FOREIGN PATENT DOCUMENTS

| 0 381 511 | 8/1990 | (EP) . |
| 0 533 551 | 3/1993 | (EP) . |
| 0 553 852 | 8/1993 | (EP) . |
| 0 767 486 | 4/1997 | (EP) . |
| 0 793 263 | 9/1997 | (EP) . |
| 5-211128 | 8/1993 | (JP) . |
| 7-302889 | 11/1995 | (JP) . |
| 8-213645 | 8/1996 | (JP) . |

OTHER PUBLICATIONS

Milnes et al. "Peeled Film Technology for Solar Cells", 11th IEEE Photovoltaic Spec. Conf., Scottsdale, pp. 338–341 (1975).
Patent Abstracts of Japan, vol. 013, No. 379 (C–628), Aug. 22, 1989 (corresponds to JP 01–131031).
G. W. Cullen, ed., "Single–Crystal Silicon On Non–Single–Crystal Insulators", J. Crys. Grow., vol. 63, No. 3, pp. 429–590 (1983).
C. Harendt, "Silicon on Insulator Material by Wafer Bonding", J. Elect. Mater., vol. 20, No. 3, pp. 267–277 (1991).
H. Baumgart, "Light Scattering Topography Characterization of Bonded SOI Wafers", Proc. of 1st Intl. Symp. on Semiconductor Wafer Bonding, pp. 375–385 (1991).

(List continued on next page.)

Primary Examiner—Olik Chaudhuri
Assistant Examiner—William David Coleman
(74) Attorney, Agent, or Firm—Fitzpatrick, Cella, Harper & Scinto

(57) ABSTRACT

There are provided a method of producing an SOI wafer of high quality with excellent controllability, productivity and economy and a wafer produced by such a method. In the method of producing a substrate utilizing wafer bonding, a first substrate member and a second substrate member are mutually bonded, and then the second substrate member is separated from the first substrate member at the interface of a first layer and a second layer formed on the main surface of the first substrate member, whereby the second layer is transferred onto the second substrate member. In the separation, the separation position at the interface of the first and the second layers is ensured by varying the porosity of a porous Si layer, forming an easily separable plane by the coagulation of pores in porous Si, effecting ion implantation to the interface or utilizing a heteroepitaxial interface.

34 Claims, 6 Drawing Sheets

OTHER PUBLICATIONS

C.E. Hunt, "Thinning of Bonded Wafers: Etch–Stop Approaches", Proc. of 1st Intl. Symp. on Semiconductor Wafer Bonding, pp. 165–173 (1991).

A. Uhlir, "Electrolytic Shaping of Germanium and Silicon", Bell Sys. Tech. J., vol. 35, pp. 333–347 (1956).

T. Unagami, "Formation Mechanism of Porous Silicon Layer by Anodization in HF Solution", J. Electrochem. Soc., vol. 127, No. 2, pp. 476–483 (1980).

W.P. Maszara, "Silicon–On–Insulator by Wafer Bonding: A Review", J. Electrochem. Soc., vol. 138, No. 1, pp. 341–347 (1991).

V. Raineri, "Silicon–on–insulator produced by helium implantation and thermal oxidation", Appl. Phys. Lett. vol. 66, No. 26, pp. 3654–3656 (1995).

K. Imai, "A New Dielectric Isolation Method Using Porous Silicon", Solid State Elect., vol. 24, pp. 159–164 (1980).

K. Imai, "Crystalline Quality of Silicon Layer Formed by FIPOS Technology", J. Cryst. Grow., vol. 63, pp. 547–553 (1983).

T. Yonehara, "Epitaxial layer transfer by bond and etch back of porous Si", Appl. Phys. Lett., vol. 64, No. 16, pp. 2108–2110 (1994).

A. VanVeen, "Helium–Induced Porous Layer Formation in Silcon", Mat. Res. Soc. Symp. Proc, vol. 107, pp. 449–454 (1988).

K. Nagano et al., "Oxidized Porous Silicon and It's Application", Tech. Res. Rep. of Elec. Comm. Soc., vol. 79, SSD79–9549 (1979).

H. Tayanaka et al., "Separation of Thin Epitaxial Si Film on Porous Si for Solar Cells", Preprints for 1996 Fall Congress of Appl. Phys. soc., p. 673 (1996).

N. Sato et al., "Epitaxial Growth on Porous Si for a New Bond and Etchback Silicon–on–Insulator", J. Electrochem. Soc., vol. 142, No. 9, pp. 3116–3122 (1995).

* cited by examiner

SUBSTRATE AND PRODUCTION METHOD THEREOF

BACKGROUND OF THE INVENTION

1. Field of the Invention

The present invention relates to a method for producing a semiconductor substrate, and more particularly a method for producing a semiconductor substrate adapted for the formation of an electronic device or an integrated circuit in a single-crystal semiconductor layer on a dielectric separation layer or an insulator, or in a single-crystal compound semiconductor on an Si substrate.

2. Related Background Art

The formation of a single-crystal Si semiconductor layer on an insulator is widely known as semiconductor-on-insulator (SOI) technology, and various research has been made because the device utilizing the SOI technology has various advantages that cannot be attained with the use of a bulk Si substrate in the preparation of ordinary Si integrated circuits. More specifically, the use of the SOI technology provides the following advantages:

1. dielectric separation can be easily conducted to attain a higher degree of integration;
2. radiation resistance is excellent;
3. stray capacitance can be reduced to attain a higher speed;
4. a well forming step can be omitted;
5. latch-up can be prevented; and
6. a fully depleted field effect transistor can be made by thin film formation.

These features are detailed, for example, in Special Issue:
"Single-crystal silicon on non-single-crystal insulators", edited by G. W. Cullen, Journal of Crystal Growth, Vol. 63, No. 3, pp.429–590 (1983).

Also in recent years, many reports have been published on the SOI substrate for realizing higher speed and lower power consumption in the MOSFET (IEEE SOI conference 1994). Also use of the SOI substrate allows for the shortening of device process steps, since the presence of an insulator layer under the device simplifies the device isolation process in comparison with the case of device formation on a bulk Si wafer. Thus, in comparison with the MOSFET or IC formed on bulk Si, a total reduction of the wafer cost, and the process cost together with a higher performance, is expected.

In particular, the fully depleted MOSFET is expected to achieve higher speed and lower power consumption by improvement of a driving power. The threshold voltage (V+h) of the MOSFET is generally determined by the impurity concentration of the channel portion, and in case of the fully depleted MOSFET utilizing the SOI structure, the thickness of the depletion layer is also affected by the film thickness of SOI. Consequently, in order to produce large-area integrated circuits with high production yield, there has strongly been desired uniformity of SOI film thickness.

Also the devices formed on the compound semiconductor have excellent features, such as high speed or light emission, which are not achievable with the silicon substrate. Presently such devices are mostly formed by epitaxial growth on a compound semiconductor substrate such as GaAs or the like. However, such a compound semiconductor substrate has drawbacks related to expense, low mechanical strength, difficulty of preparation of a large area wafer and the like.

In view of such a situation, there has been made an attempt to heteroepitaxially grow a compound semiconductor on the silicon wafer which is inexpensive, mechanically strong and can be easily prepared with a large area.

Investigations on the formation of the SOI substrate have been active since the 1970's. In the initial period, there have been investigated a method of heteroepitaxially growing a single-crystal silicon on an insulating sapphire substrate (SOS: silicon on sapphire) and a method of forming the SOI structure by dielectric separation utilizing oxidation of porous Si (FIPOS: full isolation by porous oxidized silicon).

The FIPOS method consists of forming islands of n-type Si layer on the surface of a p-type single-crystal Si substrate by proton implantation (Imai et al., J. Crystal Growth, Vol. 63, 547 (1983)) or by epitaxial growth and patterning, then making only the p-type Si substrate porous by anodizing in HF solution so as to surround the Si islands from the surface side and achieving dielectric isolation of the n-type Si islands by accelerated oxidation. Since in this method the isolated Si islands are determined prior to the device manufacturing step, the freedom of device designing may be limited.

An oxygen ion implantation method referred to as the SIMOX method was originally reported by K. Izumi. After oxygen ions are implanted with a concentration of $10^{17}$ to $10^{18}/cm^2$ into an Si wafer, it is annealed at a high temperature of about 1320° C. in an argon-oxygen atmosphere, whereby the implanted oxygen ions combine with Si atoms around a depth corresponding to the projected stroke (Rp) of the ion implantation to form a silicon oxide layer. In this operation, a Si layer present on the oxidized silicon layer and made amorphous by oxygen ion implantation recrystallizes to form a single-crystal silicon layer. The number of defects in the surface Si layer was as high as $10^5/cm^2$, but has been reduced to about $10^2/cm^2$ by maintaining the implanted amount of oxygen ions at about $4\times10^{17}/cm^2$. However, since the implantation energy and the implantation amount are limited to a narrow range in order to maintain desired film quality of the Si oxide layer and desired crystallinity of the surface Si layer, the thicknesses of the surface Si layer and the buried Si oxide (BOX: buried oxide) layer have been limited to specified values. Therefore, for obtaining the surface Si layer of a desired film thickness, it has been necessary to effect sacrifice oxidation or epitaxial growth. In such a case, there is a problem that the uniformity of the film thickness inevitably deteriorates, since the deterioration of the uniformity of the film thickness due to such a process is added to the original film thickness distribution.

It has also been reported that the BOX layer contains a region, called "pipe", of defective Si oxide formation. One of the causes of such a defective formation is foreign matter such as dust at the implantation. In the portion of such a pipe, there is generated a leak between an active layer and a supporting substrate which deteriorates the device characteristics.

The ion implantation of the SIMOX method with a larger amount of implantation in comparison with that in the ordinary semiconductor process requires a long implantation time even when using an apparatus developed exclusively for this purpose. Since the ion implantation is conducted by rester scanning with an ion beam of a predetermined current or by expanding an ion beam, it is anticipated to require a longer time with an increase in the area of the wafer. Also the high-temperature heat treatment of a wafer having a large area is anticipated to become more difficult, because of the generation of problems such as slip due to the temperature distribution within the wafer. As the SIMOX method requires a heat treatment at 1300° C. or higher which is not usually employed in the Si semiconductor process, there is concerned an increase in the problems to be solved such as apparatus development, metal contamination and slip.

In addition to the conventional SOI forming methods described above, there is recently contemplated a method of bonding a single-crystal Si substrate to another thermally oxidized single-crystal Si substrate by heat treatment or with an adhesive to obtain the SOI structure. In this method, an active layer for device formation has to be formed as a uniform thin film. Stated differently a single-crystal Si substrate of a thickness of several hundred micrometers has to be formed as a thin film on the order of a micrometer or less. This formation of the thin film is conducted by three methods as described below:

1. thin film formation by polishing
2. thin film formation by local plasma etching
3. thin film formation by selective etching.

By the above method 1, it is difficult to provide a uniform thin film by polishing. In particular, fluctuation in thickness becomes as high as several tens of percent when forming a thin film of submicron thickness, and the formation of a uniform thin film becomes a large problem. The difficulty of forming a thin film becomes more severe with an increase in a wafer diameter.

In the above method 2, after forming a thin film of about 1 to 3 $\mu$m by the grinding of method 1, thickness distribution is measured in many points over the entire surface and then plasma etching is conducted while scanning a plasma beam of a diameter of several mm, for example, of $SF_6$ to correct the thickness distribution on the basis of the measured distribution, thereby forming a thin film of a desired thickness. It is reported that this method has achieved a film thickness distribution of about ±10 nm. However, if a particle is present on a substrate during the plasma etching, such a particle functions as an etching mask, so that a projection is formed on the substrate.

Also as the surface after the plasma etching is coarse, a touch polishing operation is required after the plasma etching, but the difficulty in the control of the final film thickness and the deterioration of the film thickness distribution by the polishing operation are noted since the polished amount is controlled by the polishing time. Besides, as the polishing material such as colloidal silica comes into direct contact with the surface of an active layer in the polishing operation, there are concerns regarding the formation of a crushed layer and the generation of a working strain due to the polishing operation. Furthermore, as the wafer area becomes larger, the plasma etching time increases proportionally with an increase in the wafer area, possibly leading to a significant decrease in a throughput.

The above method 3 consists of providing in advance a substrate to be formed into a thin film structure which can be selectively etched. For example, on a p-type substrate, a thin $p^+$-type Si layer containing boron atoms at a concentration of $10^{19}/cm^3$ or more and a thin p-type Si layer are stacked, for example, by epitaxial growth to obtain a first substrate. This substrate is adhered to a second substrate with interposition of an insulating layer such as an oxide film, and the first substrate is made thin by grinding and polishing from the rear surface. Subsequently the p-type layer is selectively etched to expose the $p^+$-type layer, and the $p^+$-type layer is then selectively etched to expose the p-type layer, thereby completing the SOI structure. This method is reported in detail by Maszara (W. P. Maszara, J. Electrochem. Soc., Vol. 138, 341 (1991)).

The selective etching method is considered effective for obtaining a uniform thin film, but has the following problems.

(1) A selective ratio is about $10^2$ and is not sufficient.
(2) Touch polishing is necessary after the etching because the surface after the etching is coarse. As a result, however, the uniformity of film thickness tends deteriorate with a decrease in film thickness. Also the polishing amount is controlled by the polishing time, but is difficult to control because of the fluctuation in the polishing rate. This is particularly a problem in the formation of an ultra thin SOI layer such as of 100 nm.
(3) The crystallinity of the SOI layer is insufficient because the ion implantation, epitaxial or heteroepitaxial growth is conducted on the high-concentration boron-doped Si layer. Also the property of the surface to be bonded is inferior to that of the ordinary Si wafer.

The above points are reported by C. Harendt et al., J. Elect. Mater., Vol. 20, 267 (1991), H. Baumgart et al., Proceeding of the 1st International Symposium on Semiconductor Wafer Bonding: Science, Technology and Applications, (The Electrochemical Society) Vol. 92-7, p.375, and C. E. Hunt et al., Proceeding of the 1st International Symposium on Semiconductor Wafer Bonding: Science, Technology and Applications (The Electrochemical Society) Vol. 92-7, p.165.

Also the selectivity of the selective etching greatly depends on a difference in a concentration of the impurity such as boron and the profile steepness of the impurity in the direction of depth. Therefore, if there is conducted a high-temperature bonding annealing for increasing a bonding strength or a high-temperature epitaxial growth for improving crystallinity, the distribution of the impurity concentration is spread in the direction of depth, thereby deteriorating the etching selectivity. That is, the improvement in the etching selectivity has not been compatible with the improvement in the crystallinity and in the bonding strength.

Recently Yonehara et al. reported a bonding SOI method which is free from the above problems and is excellent in film thickness uniformity and in crystallinity and which enables a batch process (T. Yonehara et al., Appl. Phys. Letter, Vol. 64, 2108 (1994)). This method employs a porous layer 32 on a first Si substrate 31 as a material for selective etching. After a non-porous single-crystal Si layer 33 is epitaxially grown on a porous layer, it is bonded to a second substrate 34 via an Si oxide (insulator) layer 35 (FIG. 5A). The first substrate is made thin, for example, by grinding from the rear surface to expose the porous Si layer over the entire area of the substrate (FIG. 5B). The exposed porous Si is removed by etching with a selective etching solution such as KOH or $HF+H_2O_2$ (FIG. 5C). In this operation, the selective ratio of the etching of porous Si to bulk Si (non-porous single-crystal Si) can be made as high as 100,000 times so that an SOI substrate can be formed by leaving, on the second substrate, the non-porous single-crystal Si layer grown in advance on the porous layer, without any substantial change in the film thickness. Therefore, the film thickness uniformity of SOI can be substantially determined by the epitaxial growth operation. As the epitaxial growth can be conducted in a CVD apparatus employed in the ordinary semiconductor process, there has been achieved a uniformity, for example, of 100±2% according the report of Sato et al. (SSDM 95). Also it has been reported that the crystallinity of the epitaxial Si layer is a satisfactory value of $3.5 \times 10^2/cm^2$.

Porous Si was found by Uhlir et al. in 1956 in the course of an investigation of electropolishing of a semiconductor (A. Uhlir, Bell Syst. Tech. J., Vol. 35, 333 (1956)). The porous Si can be formed by anodization of an Si substrate in HF solution and has a sponge-like shape having minute pores which is formed from bulk Si by electrolytic etching. The pores have a diameter of about several nanometers and are formed with a density, for example, of $10^{11}/cm^2$, though these are variable depending on the conditions of anodization and the specific resistivity of Si.

Unagami et al. has investigated the dissolution reaction of Si upon anodization and reported that the anodization reaction of Si in HF solution requires positive holes. The reaction is as follows (T. Unagami, J. Electrochem. Soc., Vol. 127, 476 (1980)):

$$Si+2HF+(2-N) e^+ \rightarrow SiF_2+2H^++ne^-$$

$$SiF_2+2HF \rightarrow SiF_4+H_2$$

$$SiF_4+2HF \rightarrow H_2SiF_6$$

or $$Si+4HF+(4-\lambda) e^+ \rightarrow SiF_4+4H^++\lambda e^-$$

$$SiF_4+2HF \rightarrow H_2SiF_6$$

wherein $e^+$ and $e^-$ represent a positive hole and an electron, respectively. Also n and $\lambda$ are the number of positive holes required for dissolving one Si atom, and it has been reported that porous Si is formed under a condition of n>2 or $\lambda$>4.

According to this report, p-type Si containing positive holes can be made porous but n-type Si is not made porous. This selectivity of the porous structure formation has been proved by Nagano et al. and Imai (Nagano, Nakajima, Anno, Onaka and Kajiwara, Technical Research Report of Electronic Communications Society, Vol. 79, SSD79-9549 (1979); and K. Imai, Solid-State Electronics, Vol. 24, 159 (1981)).

In the conventional method, the selectivity of etching depends on a difference in an impurity concentration and a profile thereof in the depth direction of, so that the temperature of heat treatment (in bonding, epitaxial growth, oxidation, etc.) which spreads the distribution of the concentration is limited to about 800° C. or lower. On the other hand, in this method, since the etching rate is determined by a difference between the porous structure and the bulk structure, the heat treatment involves little limitation in the heat treatment temperature and has been reported achievable at about 1180° C. For example, the heat treatment after bonding is known to increase the bonding strength of the bonded wafers and to decrease the number and the size of the voids generated in the bonding interface. Also in the etching based on such a structural difference, particles eventually deposited on the porous Si do not influence the uniformity of film thickness.

Also in case of a light-transmissive substrate generally having an irregular crystalline structure such as glass, a thin Si film deposited thereon usually becomes amorphous or polycrystalline at best, reflecting the crystalline irregularity of the substrate, so that a high-performance device cannot be prepared on such a substrate. This is based on a fact that the substrate is amorphous, and therefore a satisfactory single-crystal layer cannot be obtained by merely depositing an Si layer thereon.

On the other hand, the semiconductor substrate employing the bonding method always requires two wafers, one of which is mostly removed by polishing or etching, thus leading to increased cost and eventually resulting in significant waste of limited resources.

For this reason, in order to exploit the features of SOI employing the bonding process, there has been desired a method capable of reproducibility providing an SOI substrate of satisfactory quality and at the same time realizing the saving of resources and cost reduction, for example, by reuse of the wafers.

Recently Sakaguchi et al. has reported a method of reusing a first substrate which is consumed in a bonding step (Japanese Patent Application Laid-Open No. 07-302889).

In the above method of conducting bonding and etch-back by using porous Si, they adopted the following method instead of the step of exposing porous Si by polishing or etching the first substrate from the rear surface thereof.

After the surface region of a first Si substrate 41 is made porous to form a porous layer 42, a single-crystal Si layer 43 is formed thereon, and this single-crystal Si layer 43 is adhered via an insulating layer 45 to the main face of a second Si substrate 44 which is separate from the first substrate 41 (FIG. 6A). Then the bonded wafers are divided by the porous layer (FIG. 6B), and the porous Si layer remaining on the surface of the second Si substrate is selectively removed by etching to obtain an SOI substrate (FIG. 6C). The division of the bonded wafers is achieved by destruction of the porous Si layer by:

applying a sufficient and uniform tensile force or pressure to the whole of the wafers in a direction perpendicular to the inside face of the bonded wafers;

applying a vibration energy such as an ultrasonic wave;

exposing the porous layer at the edge of the wafers, etching the exposed portion of the porous Si layer by a certain amount and inserting a razor blade or the like into such an etched portion;

exposing the porous layer at the edge of the wafers, impregnating the porous Si layer with liquid such as water, and heating or cooling the entirety of the bonded wafers to cause expansion of the liquid; or applying a force to the first (or second) wafer in a direction parallel to the second (or first) substrate.

These methods are based on a fact that though the mechanical strength of porous Si is dependent on the level of porosity, it is believed that the strength is sufficiently lower than that of bulk Si. For example, if the porosity is 50%, the mechanical strength of a porous layer is considered to be about half that of bulk Si. Thus, if a compressing force, a tensile force or a shearing force is applied to the bonded wafers, the porous Si layer is broken first. The porous layer can be broken with a weaker force by an increase in the level of porosity.

The porosity is defined as the percentage of pore volume with respect to the apparent volume of a porous layer, that is, the sum of the volume of a material constituting the porous layer and the pore volume.

However, in the method disclosed in the Japanese Patent Application Laid-Open No. 07-302889, the position of separation within the thickness of the porous layer in a thickness direction cannot be defined, so that the wafer yield deteriorates in some cases because such a position of separation varies in each wafer. Besides, the thickness of the porous Si layer remaining after separation of the wafers has significant fluctuation. Therefore, even using highly selective etching, the wafer yield was deteriorated in some cases in order to satisfy the requirement for the highly uniform film thickness for SOI.

Also the Japanese Patent Application Laid-Open No. 8-213645 describes a method of separation by the porous layer, but does not describe the layer structure of the porous layer. Separately Tayanaka et al. of Sony reported, in Preprints for 1996 Fall Congress of Applied Physics Society, p.673, the preparation of porous Si by a change in the current in the course of processing.

The Japanese Patent Application Laid-Open No. 8-213645 describes that the separation takes place at any position of the separation layer; that is, that the separating position cannot be defined. In such case, the thickness of the remaining porous Si layer fluctuates over the wafer, and, when the porous Si is removed by etching, an active layer (device forming layer) is more or less etched also to result in a fluctuating thickness in the plane of the wafer as long as the etching rate for the active layer consisting of a non-porous single crystal is not zero. Also even if the remaining porous Si is left, the surface step coverage resulting from the separating position is left on the wafer. Also the method described in the above-mentioned Preprints for 1996 Fall Congress of Applied Physics Society, p.673 describes that the separation takes place by the center portion of the porous Si, so that the porous Si layers remaining on both wafers have to be removed.

For preparing the bonding SOI substrate of satisfactory quality, the etching step of the porous layer has been considered to be essential. The etching step requires conveyance of the substrate into and from the etching apparatus, management of the etching apparatus and etchant, rinsing of the substrate after etching, etc. Therefore the preparation time of the SOI substrate can be significantly reduced if the etching step can be omitted.

SUMMARY OF THE INVENTION

An object of the present invention is to provide a method of producing a substrate, which is capable of omitting a selective etching step of the porous layer.

Another object of the present invention is to provide a method for inexpensively preparing a semiconductor substrate of satisfactory quality, represented by the SOI substrate.

The present invention provides a method for producing a substrate, comprising:

preparing a first substrate member and a first layer and a second layer provided on and adjacent to the first layer;

bonding the first substrate member to a second substrate member; and separating the first substrate member and the second substrate member to transfer the second layer onto the second substrate member, wherein the separation of the first substrate member and the second substrate member is conducted at the interface between the first layer and the second layer.

DETAILED DESCRIPTION OF THE PREFERRED EMBODIMENTS

FIGS. 1A to 1D show a basic example of the method of producing a substrate according to the present invention.

Figure 1A:
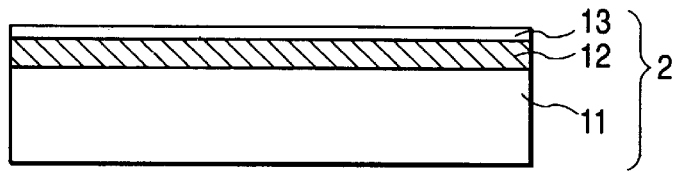
FIGS. 1A, 1B, 1C and 1D are schematic cross-sectional views showing an example of the method of producing a substrate according to the present invention.

As shown in FIG. 1A, there is prepared a first substrate member 2 having a first layer 12 and a second layer 13 provided on and adjacent to the first layer.

Figure 1B:
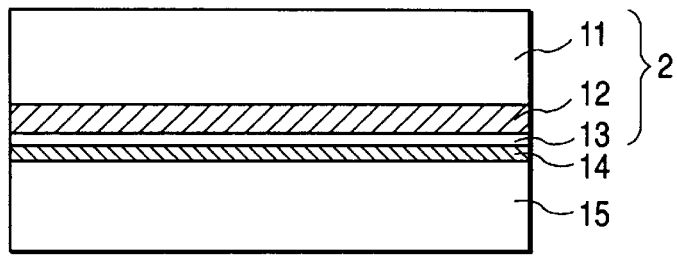

Then, as shown in FIG. 1B, the first substrate member 2 and a second substrate member 15 are bonded. Numeral 14 indicates an insulating film.

Figure 1C:
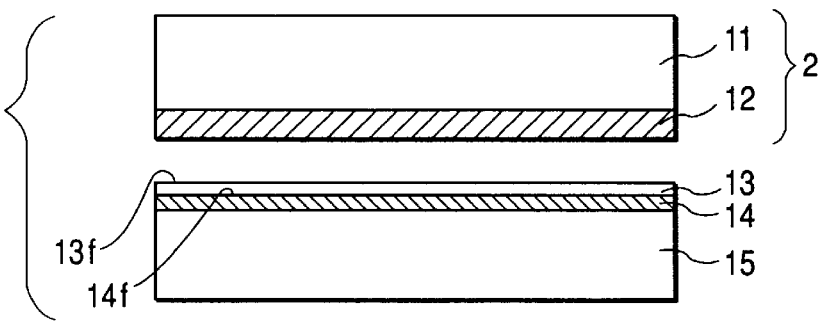

Then, as shown in FIG. 1C, the first substrate member 2 and the second substrate member 15 are separated, whereby the second layer 13 is transferred onto an insulating surface 14f of the second substrate member 15.

Since the separation takes place at the interface between the first layer 12 and the second layer 13, the first layer does not remain on the exposed surface (separation surface) 13f of the second layer 13 transferred onto the second substrate member 15.

Figure 1D:
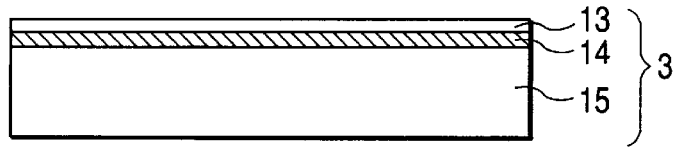

Therefore, as shown in FIG. 1D, a substrate 3 having a smooth surface can be obtained without selective etching or selective polishing of the exposed surface 13f of the second layer 13. If necessary, the surface 13f of the second layer 13 of the substrate 3 can be subjected to a smoothing treatment such as heat treatment in a non-oxidative atmosphere.

The first substrate member employed in the present invention comprises at least the first layer and the second layer which are formed of mutually different materials or have mutually different mechanical strengths.

As the second layer, a non-porous layer is used. Specific examples of the material constituting the second layer include Si and compound semiconductors such as GaAs, InP, etc., a metal and carbon, but such examples are not restrictive. Also such a layer need not necessarily be formed over the entire surface but may be partially etched by a patterning treatment. Also on such non-porous layer, an insulating layer such as an oxide film may be formed.

The second substrate member may be an Si member, an Si member having an Si oxide film formed on a surface thereof, a light-transmissive member such as quartz, fused quartz, sapphire or silica glass, or a metal member, but the material constituting the second substrate member is not restrictive.

The first substrate member and the second substrate member are preferably plate-shaped or disk-shaped.

In the case of bonding, it is preferable to provide an insulating layer such as an oxide film on the surface to be bonded of at least one of the first substrate member and the second substrate member and to bond both substrate members via such an insulating layer. FIGS. 1A to 1D show an example in which the insulating layer 14 is provided on the surface of the second substrate member 15.

In order to conduct the separation at the interface between the first layer and second layer, a mechanically weaker separation layer may be formed by using a porous layer at such interface or by ion implantation at such interface. Otherwise the mechanically weaker separation layer may be formed by introducing defects into such an interface.

The separation can be achieved, for example, by the application of an external force such as a pressure, a tensile force, a shearing force or a force by a wedge, application of an ultrasonic wave or heat, application of an internal pressure to porous Si by oxidizing porous Si to expand it from the periphery thereof, application of a thermal stress by pulsed heating, or by softening, but these are not restrictive.

In the following, there will be explained the method of forming a separation layer.

It is already known that, due to a difference in a lattice constant caused by using different materials in heteroepitaxy, defects are introduced into an interface between the different materials or into an epitaxial layer. Also in case of double heteroepitaxy (forming two hetero junctions), defects tend to be introduced into an ultra thin film based on the relationship of the thicknesses of the two epitaxial layers. Accordingly, when a different material is epitaxially grown on an ultra thin epitaxial layer, defects are introduced into such an ultra thin epitaxial layer. The interface can be made weaker by the difference in the lattice constant and the introduction of defects, and the separation can be achieved at such interface.

On the other hand, the separation layer can be formed without the use of heteroepitaxy. As an example, a porous material is used.

A porous layer can be formed, for example, by anodizing an Si substrate member in HF solution. The porous layer has a sponge-like structure, in which pores of a diameter of $10^{-1}$ to 10 nm are formed with a distance of $10^{-1}$ to 10 nm. In contrast to the density of single-crystal Si of 2.33 g/cm$^3$, the density of the porous layer can be varied within a range of 2.1 to 0.6 g/cm$^3$ by a variation in the concentration of HF solution within a range of 50 to 20% or by a variation in the current density to be used in the anodization. Thus the level of porosity can be varied. Though the density can be reduced to less than half that of single-crystal Si, porous Si still maintains monocrystallinity, so that single-crystal Si can be epitaxially grown on the porous layer. However, above 1000° C., the internal pores start to rearrange, thereby deteriorating the characteristics of accelerated etching. For this reason, the epitaxial growth of the Si layer is preferably conducted by low-temperature growth such as molecular beam epitaxial growth, plasma CVD, low-pressure CVD, photo CVD, biased sputtering or liquid phase growth. However, high-temperature growth is also possible if a protective film is formed in advance on the inside walls of the pore in the porous material, for example, by low-temperature oxidation.

As the porous layer contains a large space therein, the surface area is drastically larger in comparison with the volume. For this reason, the chemical etching rate is significantly increased in comparison with that of the ordinary single-crystal layer.

Also the mechanical strength of the porous layer, though being dependent on the porosity, is lower than that of bulk Si. Therefore, if a pressure, a traction or a shear is applied to an Si substrate comprising a porous layer in a part thereof, the porous layer is broken first. The porous layer can be broken by a weaker force when the porosity of the porous layer is increased.

In the epitaxial growth on porous Si, baking in $H_2$ as the first step is essential for improving the quality of the epitaxial layer by filling the surficial pores of the porous Si (N. Sato et al., J. Electrochem. Soc., Vol. 142, No. 9, 3116 (1995)). In this baking step in $H_2$, the outermost layer of porous Si is consumed for filling the pores. Accordingly, the separation can be achieved immediately under the epitaxial layer by forming two or more porous layers, an ultra thin outermost porous layer being formed to have a low porosity, and a porous Si layer immediately under such epitaxial layer by non-porous structure formation treatment and/or epitaxial growth being formed to have a large porosity.

Also the porous Si layer from which the oxide film is removed with HF or the porous Si layer having no oxide film exhibits pore coagulation during a heat treatment such as the above-mentioned baking in $H_2$, thereby becoming weaker in mechanical strength and being easily separable in the absence of an oxide film on the inside walls of the pores. Thus the separation by the interface of the first layer and the second layer can be achieved also by such treatment.

Otherwise, the porous Si layer, after anodization is subjected, without low-temperature oxidation, to a high-temperature process such as epitaxial growth, oxidation bonding and the like; this causes the structural change of porous Si in which the small pores obtained by the anodization coagulate and result in the expansion of the pores. Thus the separation takes place at the interface between the porous Si layer and the nonporous epitaxial Si layer by the strain therebetween due to the expansion of pores immediately below the epitaxial layer. Therefore, the separation at the interface between the first layer and the second layer can be achieved also by such treatment.

It is also well known that an ion implanted layer generates bubbles therein, assuming a structure as if a porous material is formed inside. Accordingly, such layer becomes mechanically fragile and enables accelerated oxidation or accelerated etching as in the porous layer obtained by anodization. Therefore, the separation at the interface of the first layer and the second layer can also be achieved by implanting ions into such an interface.

The ions employed in such a method are not particularly limited but can be any kind that can generate an implantation damaged layer, a high concentration layer of the implanted element (strain layer), or a bubble containing layer.

The interface referred to in the present invention means an interface substantially including the vicinity region of the interface.

With respect to the ion implantation, reference is to be made to the following.

Japanese Patent Application Laid-Open No. 5-211128 has proposed a method of forming a bubble layer by ion implantation, causing crystal rearrangement and bubble coagulation by a heat treatment and conducting the separation at the bubble layer.

It is also reported that implantation of helium or hydrogen ions into bulk Si followed by a heat treatment generates, in the implanted region, micro-cavities having a diameter of several nm to several ten nm at a density of about $10^{16}$–$10^{17}$/cm$^3$ (for example, A. Van Veen, C. C. Griffioen and J. H. Evans, Mat. Res. Soc. Symp. Proce. 107 (1988, Material Res. Soc. Pittsburgh, Pa.) P.449). The use of such micro-cavities has recently been investigated as a gettering site of a metal impurity.

V. Raineri and S. U. Campisano have reported implanting helium ions into bulk Si, following by a heat treatment, to obtain micro-cavities, then forming a groove on a substrate to expose the side face of the micro-cavities and effecting oxidation treatment, thereby selectively oxidizing the micro-cavities to obtain a buried oxidized Si layer, namely an SOI structure (V. Raineri and S. U. Campisano, Appl. Phys. Lett. 66 (1995) p.3654).

Additionally, in the substrate-producing method of the present invention, the first substrate member separated by the above-mentioned methods can be utilized, after removal of the first layer remaining on the separated face or without such removal if it is unnecessary and after a surface flattening treatment if the surface flatness is insufficient, again as the first substrate member or the second substrate member or as a substrate for other applications.

Also the separated surface of the second substrate member having the transferred second layer can be flattened by a heat treatment in a hydrogen-containing non-oxidative atmosphere, without relying on the polishing or etching employed in the ordinary semiconductor process. Such flattening by heat treatment can realize, under the selection of appropriate conditions, flatness of a level that only the atomic step is exposed locally.

As explained in the foregoing, in the present invention, it is possible to conduct separation at the interface of the first layer and the second layer over the whole substrates, thereby allowing simplification or omission of the flattening step of flattening the separated surface of the second substrate member which is considered indispensable in conventional methods. Since etching or polishing may deteriorate the thickness of the second layer transferred to the second substrate member, the uniformity of the second layer can be improved if such etching or polishing can be omitted. Thus the substrate can be produced with a high yield even when ultra high uniformity is required.

It is also possible to simultaneously bond two second substrate members onto both sides of the first substrate and conduct bonding, separation and layer transfer to obtain two substrates.

By forming the second layer as a deposited film, particularly an epitaxial film, there can be excluded defects specific to bulk Si, so that the production yield of the devices can be improved. Even in the current technology, an epitaxial wafer having such a film is employed for producing high-performance devices such as CPUs. With the increasing size of the wafers, the preparation of a high-quality crystal is considered more difficult, so that the quality of the bulk wafer will inevitably decrease. Accordingly, there will increase the necessity for the epitaxial Si film and the epitaxially grown film also in the bonding SOI.

Also the conductivity type and the impurity concentration of the semiconductor layer in the SOI substrate can be arbitrarily determined by controlling those of the epitaxial film. It is therefore possible to prepare, from the same first substrate member, the SOI substrate having the semiconductor layer of varied conductivity types and impurity concentrations, so that use of an epitaxial film widens the range of applications.

It is furthermore possible to easily obtain an SOI substrate having a high-concentration buried layer. Such advantages cannot be obtained by the method of separating the outermost layer of the bulk wafer by ion implantation, as disclosed in the Japanese Patent Application Laid-Open No. 5-211128.

In case the first layer and the second layer are both constituted by epitaxial films, the substrate member is not consumed by the formation of the first layer and the second layer, so that the first substrate member can be semi-perpetually reused without any loss in the thickness.

As explained in the foregoing, the present invention allows the transfer of an Si layer of excellent crystallinity or a non-porous single-crystal compound semiconductor layer onto the insulating surface of an economically excellent substrate having a large area, while sufficiently suppressing cracks resulting from a difference in lattice constant or in thermal expansion coefficient, which is a problem encountered by conventional methods, thereby forming a semiconductor layer of satisfactory crystallinity on the insulating surface of a substrate member.

Figure 2A:
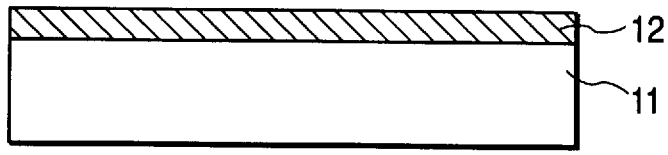
FIGS. 2A, 2B, 2C, 2D, 2E and 2F are schematic cross-sectional views showing another example of the method of producing a substrate according to the present invention.
Figure 2B:
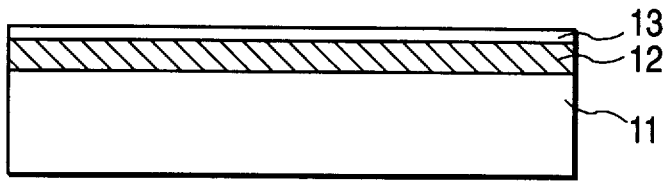
Figure 2C:
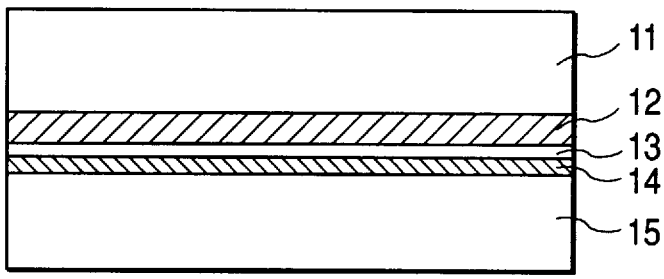

With reference to FIGS. 2A to 2F, among the substrate producing methods of the present invention, an example of the method of conducting separation utilizing a porous layer is described below. As shown in FIG. 2A, there is prepared a first single-crystal substrate member 11 such as an Si wafer, and at least a first layer 12 is formed on a main surface thereof. Then, as shown in FIG. 2B, at least a second layer 13 is formed at least on the first layer 12. The second layer 13 can be arbitrarily selected from a single-crystal Si layer, a polycrystalline Si layer, an amorphous Si layer, a layer of which a porous surface layer is made non-porous, a metal film, a compound semiconductor film, a superconductive film and the like. A device structure such as a MOSFET may be formed in such a layer or film. When the second layer has a multi-layered structure, there can be obtained an SOI structure having a buried layer. An insulating layer 14 such as of $SiO_2$ is formed on the outermost layer of the second layer 13, in order to make the potential level of the bonding interface distant from an active layer. Then, as shown in FIG. 2C, the surface of a second substrate member 15 is bonded to the surface of the layer 14 of the first substrate member at room temperature.

In the case of depositing single-crystal Si as the second layer, the bonding is preferably conducted after oxidized Si is formed, for example, by thermal oxidation on the surface of such single-crystal Si. The second substrate member can be selected, for example, from an Si substrate, an Si substrate having an oxidized Si film thereon, a light-transmissive substrate such as quartz, a sapphire substrate and the like, but these examples are not restrictive and any substrate having a sufficiently smooth bonding surface may be employed. FIG. 2C shows a state in which the second substrate member is bonded to the first substrate member via the insulating layer 14 formed on the surface of the first substrate member, but the insulating layer 14 may be omitted when the second layer 13 is not composed of Si or when the second substrate member is not composed of Si.

The bonding may be conducted using three members, namely by interposing an insulating member between the first substrate member 11 and the second substrate member 15.

A heat treatment is then applied in order to increase the bonding strength.

Figure 2D:
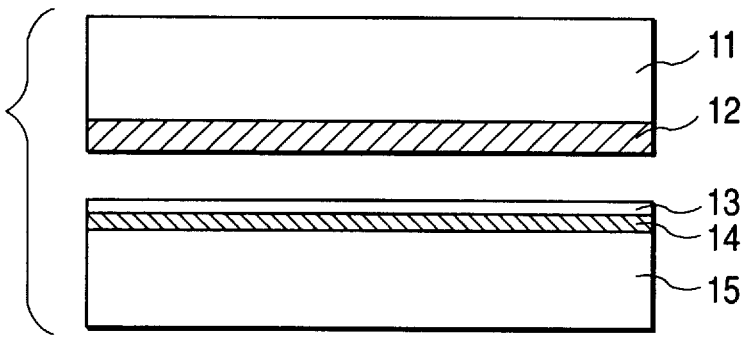

Then, as shown in FIG. 2D, the two substrate members are separated by the interface of the first layer 12 and the second layer 13. At the interface of the first layer and the second layer or in the vicinity thereof, there are in advance formed a latent factor constituting a separation layer at the interface between the first layer 12 and the second layer 13 or in the vicinity thereof. The examples of the factor defining the separation layer include, as described in the foregoing, a variation in the porosity or in the pore size resulting from the anodizing conditions or the subsequent heat treatment, a difference in the thermal expansion coefficient between two different materials, and introduction of an element, a defect layer or a bubble layer by ion implantation. The separation can be achieved, as described in the foregoing, by the application of an external force such as a pressure, a traction, a shear or a wedge force, application of an ultrasonic wave or heat, application of an internal pressure to the porous Si by expansion from the periphery of the porous Si due to oxidation of the porous Si, application or a thermal stress by pulsed heating, or by softening, but these are not restrictive.

Figure 2E:
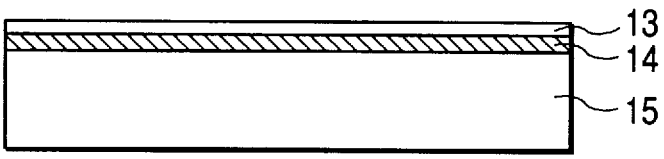

As shown in FIG. 2E, there is obtained a semiconductor substrate in which the first layer 12 does not remain on the separating surface of the second layer 13. On the second substrate member 15, the second layer 13 is formed flat and uniformly thin over the entire region of the substrate. Thus the semiconductor substrate, which is obtained by bonding the second substrate member 15 and the first substrate 14 member 11 via the insulating layer 14, constitutes an SOI substrate adequate for the preparation of isolated electronic devices.

If the surface of the second substrate member 15 after separation, namely the separated surface of the second layer, has unpermissible surface irregularities, there is conducted a surface smoothing treatment such as heat treatment in a non-oxidative atmosphere.

Figure 2F:
Figure 3A:
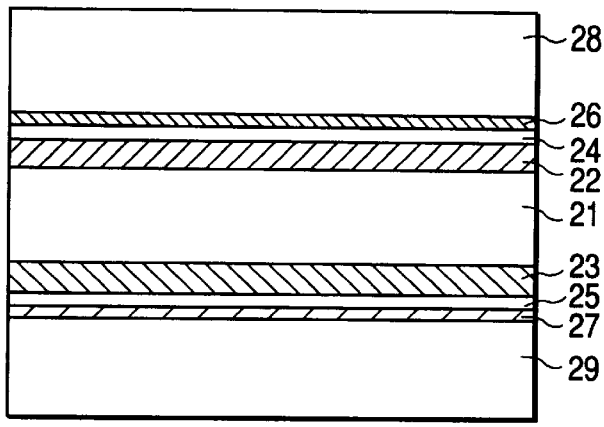
FIGS. 3A, 3B, 3C and 3D are schematic cross-sectional views showing still another example of the method of producing a substrate according to the present invention.
Figure 3B:
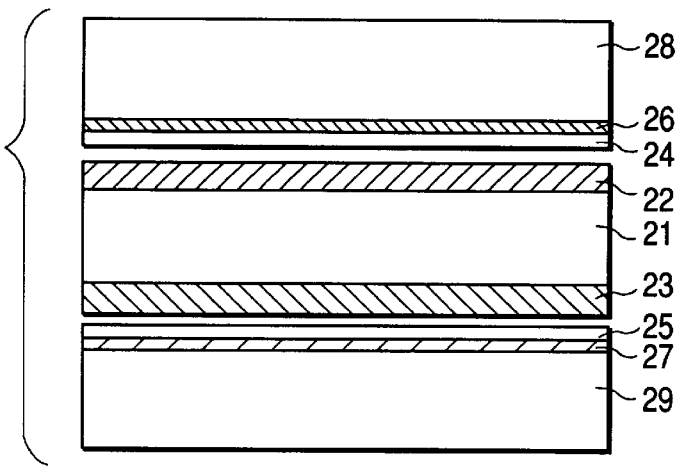
Figure 3C:
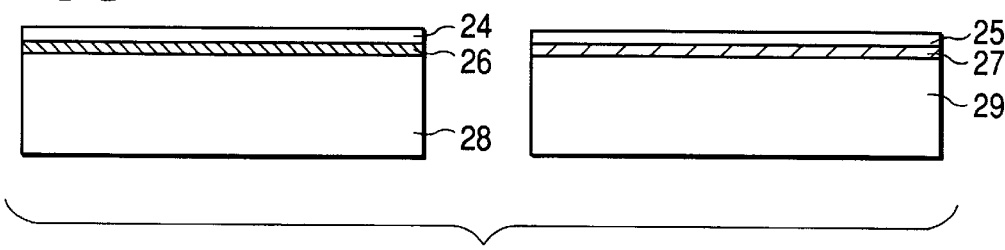
Figure 3D:

The first substrate member 11 is used again as the first substrate member 11 or as the second substrate member 15 for the preparation of the SOI substrate, if necessary after the removal of the first layer 12 remaining on the first substrate member and the surface smoothing (cf. FIG. 2F).

It is also possible, as shown in FIGS. 3A to 3D, to use two semiconductor substrate members at the same time, bond two second substrate members to both sides of the first substrate member, employing the steps shown in FIGS. 1A to 1D or in FIGS. 2A to 2F.

The first substrate member 21 can be used again as the first substrate member 21 or as the second substrate member 28 (or 29) for the preparation of another SOI substrate, if necessary after the removal of the first layer 22 or 23 remaining on the first substrate member and after the surface smoothing when the surface has unpermissible irregularities.

The substrate members 28 and 29 need not be of the same material. Also the non-porous films 24, 25 need not be of the same material, and the insulating layers 26 and 27 may be omitted.

FIGS. 4A to 4D show, among the substrate producing methods of the present invention, a method of conducting separation using a plurality of porous layers.

Figure 4A:
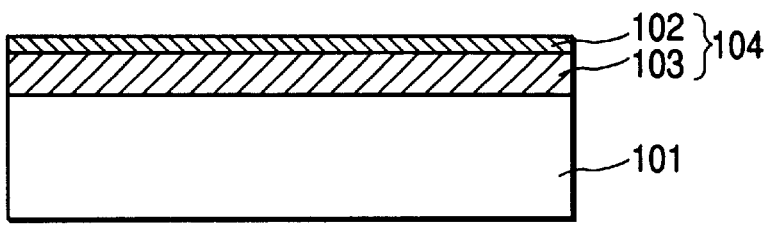
FIGS. 4A, 4B, 4C and 4D are schematic cross-sectional views showing still another example of the method of producing a substrate according to the present invention.

On the surface of a first substrate 101, as shown in FIG. 4A, there is formed a porous region 104 consisting of a first porous layer 102 and a second porous layer 103 of a higher porosity in comparison with the first porous layer 102. The porous region may be obtained by making porous the surface portion of a non-porous substrate member or by forming a porous region on the surface of a non-porous substrate member. The second porous layer 103 is preferably made thicker than the first porous layer 102.

Figure 4B:
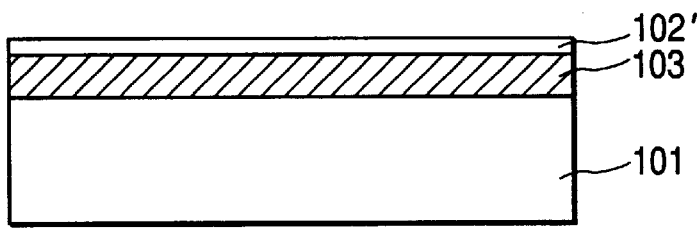

Then, as shown in FIG. 4B, the first porous layer 102 is converted into a non-porous layer 102'. Such conversion can be achieved, for example, by heat treatment of the porous layer 102 in a non-oxidative atmosphere. The non-oxidative atmosphere is desirably a hydrogen-containing atmosphere as described above, and the temperature of the heat treatment is less than the melting point of the material constituting the porous layer, specifically within a range from 600° C. to 1400° C., preferably from 900° C. to 1200° C. The heat treating time is suitably determined according to the porosity and the thickness of the first porous layer so as to convert the first porous layer entirely to a nonporous layer. In this operation, the second porous layer 103 is not converted into a non-porous layer.

Figure 4C:
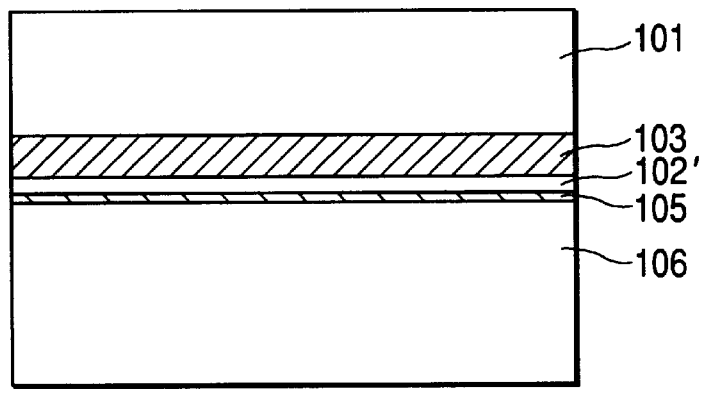

Then the first substrate 101 is bonded to a second substrate 106, as shown in FIG. 4C, such that the surface of the non-porous layer 102' is in contact with the surface of the second substrate 106, if necessary via another layer 105.

Such another layer 105 is composed of a material different from that of the layer 102' and may be formed in advance on either or both of the surfaces of the layer 102' and the second substrate member 106 prior to the bonding.

The layer 105 may also be omitted when the layer 102' and the second substrate member 106 are of different materials.

Figure 4D:
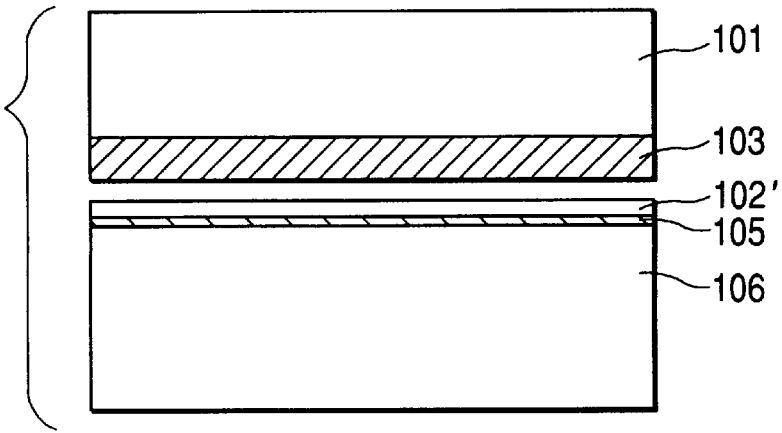
Figure 5A:
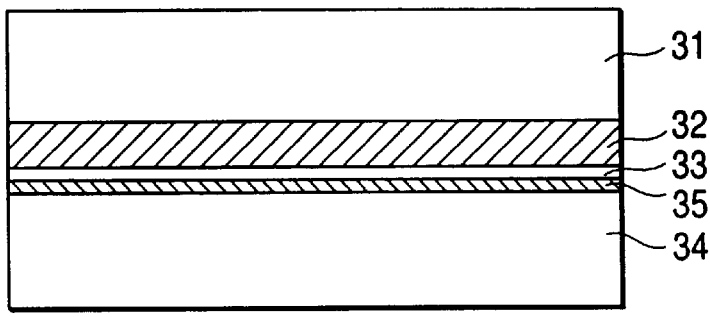
FIGS. 5A, 5B and 5C are schematic cross-sectional views showing a first conventional method.
Figure 5B:
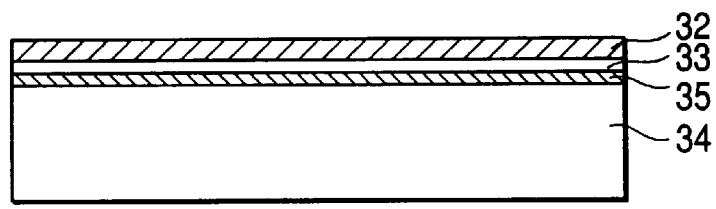
Figure 5C:
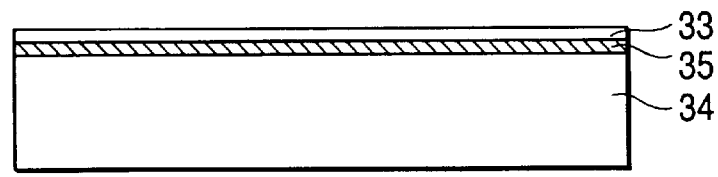
Figure 6A:
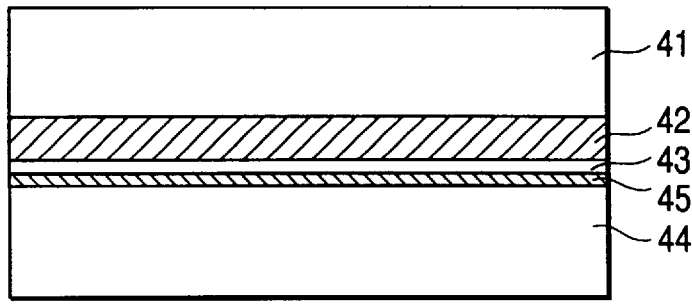
FIGS. 6A, 6B and 6C are schematic cross-sectional views showing a second conventional method.
Figure 6B:
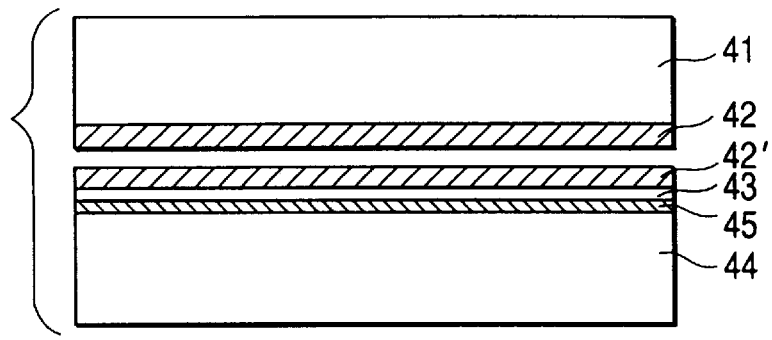
Figure 6C:
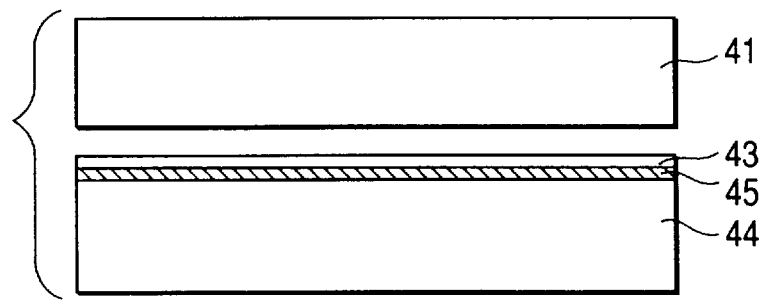

Then, as shown in FIG. 4D, the bonded substrate members 101 and 106 are separated by the application of an external force or by the generation of an internal pressure, whereby the substrate members are mutually divided by the interface between the second porous layer 103 and the non-porous layer 102', which is different from the bonding interface. In this operation, a part of the second porous layer 103 in the vicinity of such a separating interface may be broken and lost.

Since the separation can be achieved without the porous layer 103 remaining on the separated surface of the layer 102', the second substrate 106 having the layer 102' thereon need not be subjected to selective etching or selective polishing.

The second substrate 106 having the layer 102' may be heat treated, if necessary, in order to flatten the separated surface of the layer 102'.

The layer 102' can be formed by epitaxially growing a single-crystal semiconductor layer on the second porous layer 103. The layer 102' may be also formed by making the porous layer 102 non-porous and then epitaxially growing a single-crystal semiconductor layer thereon.

When the layer 102' comprises silicon, the layer 105 comprises a silicon oxide layer, for example, by oxidizing the surface of the layer 102'. When the layer 102' does not include the single-crystal semiconductor layer formed by epitaxial growth as described above, this silicon oxide layer is preferably formed as a very thin layer.

Further, between the second porous layer 103 and the substrate member 101, a third porous layer may be formed which has a porosity smaller than that of the second porous layer 103.

EXAMPLE 1

The surface of a first single-crystal Si substrate member was anodized in HF solution under the following conditions. Conditions for forming an outermost first porous layer to be formed first:
current density: 1 mA•cm$^{-2}$
anodizing solution: $HF:H_2O:C_2H_5OH=1:1:1$
time: 0.1 min
thickness of porous Si: 0.02 $\mu$m
Conditions for forming a second porous layer to be formed next:
current density: 50 mA•cm$^2$
anodizing solution: $HF:H_2O:C_2H_5OH=1:1:1$
time: 5 sec
thickness of porous Si: 0.1 $\mu$m
Conditions for forming a third porous layer to be formed last:
current density: 7 mA•cm$^{-2}$
anodizing solution: $HF:H_2O:C_2H_5OH=1:1:1$
time: 1 min
thickness of porous Si: 1 $\mu$m Under these anodizing conditions, the second porous Si layer formed using a current density of 50 mA•cm$^{-2}$ and having a thickness thicker than the first porous layer exhibits a larger porosity and becomes structurally more fragile in comparison with the other porous Si layers.

The substrate member was then oxidized for 1 hour at 400° C. in an oxygen atmosphere, whereby the internal surface of the pores of the porous Si was covered with a thermal oxide film. The wafer as the first substrate member was then placed under a hydrogen atmosphere in an epitaxy apparatus, and then was baked for 5 minutes at 1040° C., whereby the pores of the surface region of the porous Si were filled and the outermost first porous Si layer, which was formed with the current density of 1 mA·cm$^{-2}$, was made non-porous by the migration of Si atoms.

Subsequently, on the porous Si having the surface made non-porous, single-crystal Si was epitaxially grown to a thickness of 0.3 μm by CVD (chemical vapor deposition), under the following growing conditions:

Source gas: $SiH_2Cl_2/H_2$
gas flow rate: 0.5/180 l/min
gas pressure: 80 Torr
temperature: 950° C.
growth rate: 0.3 μm/min.

Then an $SiO_2$ layer of a thickness of 200 nm was formed by thermal oxidation in the surface region of the epitaxially grown Si layer.

The surface of the $SiO_2$ layer of the first substrate member was superposed and brought into contact with the surface of another Si substrate member (second substrate member) and heat treatment was conducted for 5 minutes at 1180° C., whereby strong bonding was obtained.

The bonded substrate members were separated by the application of an external force, whereby the second porous layer of a larger porosity was broken and the division took place at the interface between the nonporous layer and the porous layer.

As a result, there could be obtained an SOI substrate having a single-crystal Si layer of a thickness of 0.2 μm on the Si oxide film formed on the second substrate member. Porous Si did not remain on the surface (separated surface) of the single-crystal Si layer. The thickness of the thus formed single-crystal Si layer, measured at 100 points over the whole region thereof, exhibited a uniformity of 201±4 nm.

The SOI surface is rough, but the substrate in this state is preferably used in applications in which the surface property is not important, such as in the preparation of a solar cell or micromechanics. However, in applications very sensitive to the surface property, such as the production of a thin film transistor, it is necessary to flatten the surface of the obtained substrate by effecting a heat treatment, for example at 1100° C., in a non-oxidative atmosphere such as hydrogen. The surface roughness after the heat treatment which was evaluated by an atomic force microscope was about 0.2 nm in the root-mean-square in a region of 50 μm square and was equal to that of the commercially available Si wafer.

The cross-sectional observation by a transmission electron microscope confirmed that the epitaxially grown single-crystal Si layer did not exhibit generation of any new crystal defects but maintained excellent crystallinity.

The first substrate member was subjected to selective etching of the remaining porous Si thereon in a mixture of 49% hydrofluoric acid and 30% hydrogen peroxide solution under agitation, then to annealing in a hydrogen atmosphere and was thereafter used again as the first or the second substrate member. The third porous layer may also be omitted.

EXAMPLE 2

The surface of a first single-crystal Si substrate member was anodized in HF solution under the following conditions, thereby making the surface porous:

current density: 7 mA·cm$^2$
anodizing solution: HF: $H_2O$: $C_2H_5OH$=1:1:1
time: 5 min thickness of porous Si: 5 μm Next, single-crystal silicon was epitaxially grown to a thickness of 0.3 μm by CVD under the following growing conditions, on the thus formed porous Si without oxidation thereof:

Source gas: $SiH_2Cl_2/H_2$
gas flow rate: 0.5/180 l/min
gas pressure: 80 Torr
temperature: 950° C.
growth rate: 0.3 μm/min.

Then an $SiO_2$ layer of a thickness of 200 nm was formed by thermal oxidation in the surface of the epitaxially grown Si layer.

The surface of the $SiO_2$ layer of the first substrate member was superposed and brought into contact with the surface of another Si substrate member (second substrate member) and the bonded substrate members were annealed for 5 minutes at 1180° C., whereby strong bonding was obtained.

The bonded substrates were separated by the application of an external force, whereby the separation took place immediately under the epitaxial layer.

As explained in the foregoing, when after anodization the porous Si layer is subjected to the process of epitaxial growth, oxidation, bonding and high-temperature treatment without low-temperature oxidation, it undergoes a structural change, whereby the small pores obtained by the anodization coagulate mutually to expand the pore size. Since such pore expansion immediately under the epitaxial layer causes the strain between the porous Si layer and the epitaxial Si layer, the separation takes place at the interface therebetween.

As a result, there could be obtained a single-crystal Si layer of a thickness of 0.2 μm on the Si oxide film of the second substrate member. The porous Si did not remain on the separated surface of the single-crystal Si layer. The thickness of the thus formed single-crystal Si layer measured at 100 points over the entire region thereof exhibited a uniformity of 201±4 nm.

The SOI surface is rough, but the obtained substrate in this state is preferably used in applications in which the surface property is not important, such as in the production of a solar cell or micromechanics. However, in the present example, there was conducted a heat treatment at 1100° C. in a hydrogen atmosphere. The surface roughness which was evaluated by an atomic force microscope was about 0.2 nm in the root-mean-square in a region of 50 μm square and was equal to that of the commercially available Si wafer.

The cross-sectional observation by a transmission electron microscope confirmed that the epitaxially grown single-crystal Si layer did not exhibit generation of any new crystal defects but maintained excellent crystallinity.

The first substrate member was subjected to selective etching of the remaining porous Si in a mixture of 49% hydrofluoric acid and 30% hydrogen peroxide solution under agitation, thereby removing porous Si, and then to surface polishing, whereby the obtained substrate member could thereafter be used again as the first or the second substrate member.

EXAMPLE 3

The surface of a first single-crystal Si substrate member was anodized by immersion in HF solution under the following conditions, thereby making the surface porous:

current density: 7 mA·cm$^{-2}$
anodizing solution: HF:$H_2O$:$C_2H_5OH$=1:1:1
time: 3 min thickness of porous Si: 3 µm.

Next, the substrate member was oxidized for 1 hour at 400° C. in an oxygen atmosphere, whereby the internal surface of the pores in the porous Si was covered with a thermal oxide film. Then, on the porous Si, single-crystal Si was epitaxially grown to a thickness of 0.15 µm by CVD under the following growing conditions:

Source gas: $SiH_2Cl_2/H_2$ gas flow rate: 0.5/180 l/min gas pressure: 80 Torr temperature: 950° C.

growth rate: 0.3 µm/min.

Then an $SiO_2$ layer of a thickness of 100 nm was formed by thermal oxidation in the surface region of the epitaxially grown Si layer.

Hydrogen ion implantation was conducted from the surface of the wafer as the first substrate member in such a manner that the projected stroke reaches the vicinity of the porous Si/epitaxial Si interface. The ions to be implanted are not limited, but can be of any element that can generate a separation layer such as an implantation damaged layer, a high concentration layer of the implanted element (strain layer) or a bubble layer at the interface.

The surface of the $SiO_2$ layer of the first substrate member was superposed and brought into contact with the surface of another Si substrate member (second substrate member) and was annealed for 5 minutes, whereby strong bonding was obtained. The annealing is conducted under such condition that the implantation damaged layer, the high concentration layer of the implanted element (strain layer) or the bubble layer does not diffuse, and such a layer constitutes a separation layer.

The bonded substrate members were separated by the application of an external force, whereby the separation took place at the interface of the porous Si layer and the epitaxial Si layer.

As a result, there could be obtained a single-crystal Si layer of a thickness of 0.1 µm on the Si oxide film of the second substrate member. Porous Si did not remain on the separated surface of the single-crystal Si layer. The thickness of the thus formed single-crystal Si layer which was measured at 100 points over the entire region thereof exhibited a uniformity of 101±2 nm.

Then there was conducted a heat treatment for 1 hour at 1100° C. in hydrogen. The surface roughness evaluated by an atomic force microscope was about 0.2 nm in the root-mean-square in a region of 50 µm square and was equal to that of the commercially available Si wafer.

The cross-sectional observation by a transmission electron microscope confirmed that the epitaxially grown single-crystal Si layer did not exhibit generation of any new crystal defects but maintained excellent crystallinity.

The first substrate member was subjected to the removal of the remaining porous Si by selective etching in a mixture of 49% hydrofluoric acid and 30% hydrogen peroxide solution under agitation and could thereafter be reused as the first or the second substrate member.

EXAMPLE 4

The surface of a first single-crystal Si substrate member was anodized by immersion in HF solution under the following conditions, thereby making the surface porous:

current density: 7 mA·cm$^{-2}$ anodizing solution: $HF:H_2O:C_2H_5OH=1:1:1$ time: 5 min thickness of porous Si: 5 µm.

Next, the substrate member was oxidized for 1 hour at 400° C. in an oxygen atmosphere, whereby the internal surface of the pores in the porous Si was covered with a thermal oxide film. Then the oxide film in the surface portion of the porous Si layer was removed with HF. Thus the internal walls of the pores in the surface portion of the porous Si layer were not covered with the oxide film, but the internal walls of the pores only in the lower portion of the porous Si layer were covered with the oxide film. Then the substrate member was baked for 5 minutes at 1040° C. in hydrogen, whereby the surface pores of the porous Si were filled. Then, on the surface of the porous Si having the filled pores, there were epitaxially grown a p⁻ epitaxial layer of single-crystal Si with a thickness of 0.5 µm and an n⁺ epitaxial layer of single-crystal Si with a thickness of 1.0 µm by CVD under the following growing conditions:

source gas: $SiH_2Cl_2/H_2$ gas flow rate: 0.5/180 l/min gas pressure: 80 Torr temperature: 950° C.

growth rate: 0.3 µm/min.

Then an $SiO_2$ layer of a thickness of 200 nm was formed by thermal oxidation in the surface region of the epitaxially grown Si layer.

The surface of the $SiO_2$ layer of the first substrate member was superposed and brought into contact with the surface of another Si substrate member (second substrate member) and was annealed for 5 minutes at 1180° C., whereby strong bonding was obtained.

The bonded substrate members were separated by the application of an external force, whereby the division took place immediately under the p⁻ epitaxial layer.

Since there were conducted oxidation of the internal walls of the pores, removal of the formed oxide film and baking in hydrogen, prior to the epitaxial growth on the porous Si, the surface side layer of the porous Si lacking the oxide film on the pore wall by virtue of its removal with HF exhibited pore coagulation, whereby the surface side layer having a lowered mechanical strength was formed as the separation layer immediately under the non-porous layer.

As a result, there could be obtained a single-crystal Si layer of a thickness of 1.4 µm with an n⁺ buried layer on the Si oxide film of the second substrate member. Porous Si did not remain on the surface of the thus formed single-crystal Si layer, and the thickness of the single-crystal Si layer measured at 100 points over the entire area region thereof exhibited a uniformity of 1.4±0.02 µm.

Then the substrate member was subjected to a heat treatment for 1 hour at 1100° C. in hydrogen. The surface coarseness evaluated thereafter by an atomic force microscope was about 0.2 nm in the average square coarseness in a region of 50 µm square and was equal to that of the commercially available Si wafer.

The cross-sectional observation by a transmission electron microscope confirmed that the epitaxially grown single-crystal Si layer did not exhibit generation of any new crystal defects but maintained excellent crystallinity.

The first substrate member was subjected to surface polishing of the remaining porous Si and could thereafter be reused as the first or the second substrate member.

EXAMPLE 5

The surface of a first single-crystal Si substrate member was anodized by immersion in HF solution under the following conditions, thereby making the surface porous:

current density: 7 mA·cm$^{-2}$
anodizing solution: HF:H$_2$O:C$_2$H$_5$OH=1:1:1
time: 5 min
thickness of porous Si: 5 μm Next, the substrate member was oxidized for 1 hour at 400° C. in an oxygen atmosphere, whereby the internal surface of the pores in the porous Si was covered with a thermal oxide film. Then the thermal oxide film in the surface portion of the porous Si was removed with HF. Then the wafer as the first substrate member was placed in an epitaxy apparatus and was baked for 5 minutes at 1040° C. in hydrogen to fill the pores on the surface side of the porous Si. On the surface of the porous Si having thus filled surface pores, single-crystal GaAs was epitaxially grown to a thickness of 0.5 μm by MOCVD (metal organic chemical vapor deposition) under the following growing conditions:

source gas: TMG/AsH$_3$/H$_2$
gas pressure: 80 Torr
temperature: 700° C.

The surface of the GaAs layer of the first substrate member was superposed and brought into contact with the surface of another Si substrate member (second substrate member) and was annealed for 1 hour at 700° C., whereby strong bonding was obtained.

The bonding substrate members were separated by the application of an external force, whereby the division took place immediately under the GaAs epitaxial layer.

Since the surface side layer of the porous Si was subjected to removal of the oxide film on the pore walls with HF during baking in hydrogen prior to the epitaxial growth, the surface side layer lacking the oxide film on the pore wall exhibited pore coagulation and had a lowered mechanical strength, thereby forming a separative layer.

As a result, there could be obtained a single-crystal GaAs layer of a thickness of 0.5 μm on the second Si substrate member. The thickness of the thus formed single-crystal GaAs layer measured at 100 points over the entire region thereof exhibited a uniformity of 0.5±0.01 μm.

Thereafter surface touch polishing was conducted since the surface of the GaAs layer was rough and it was possible that some Si remained. Thus the polished surface roughness was equal to that of the commercially available GaAs wafer.

The cross-sectional observation by a transmission electron microscope confirmed that the epitaxially grown single-crystal GaAs layer did not exhibit generation of any new crystal defects but maintained excellent crystallinity.

As the second substrate member, a surface-oxidized Si substrate member may be used instead of the Si substrate member. Also the bonding may be conducted after the formation of a deposited SiO$_2$ film on the Si substrate member or on the GaAs film. In such case, the finally obtained substrate is used as GaAs on an insulating substrate member.

The first substrate member was subjected to selective etching with a mixture of 49% hydrofluoric acid and 30% hydrogen peroxide solution under agitation to remove the remaining porous Si on the first substrate member and could thereafter be used again as the first or the second substrate member.

EXAMPLE 6

On a first single-crystal Si substrate member, single-crystal Ge was epitaxially grown to a thickness of 0.02 μm by CVD under the following growing conditions:

source gas: GeH$_4$/H$_2$
gas flow rate: 0.1/180 l/min
gas pressure: 80 Torr
temperature: 700° C.
growth rate: 0.05 μm/min.

Then on the epitaxial Ge layer, single-crystal Si was epitaxially grown to a thickness of 0.5 μm by CVD under the following growing conditions:

source gas: SiH$_2$Cl$_2$/H$_2$
gas flow rate: 0.5/180 l/min
gas pressure: 80 Torr
temperature: 950° C.
growth rate: 0.3 μm/min.

Then an SiO$_2$ layer having a thickness of 200 nm was formed by thermal oxidation in the surface region of the epitaxially grown Si layer.

The surface of the SiO$_2$ layer was superposed and brought into contact with the surface of a separate Si substrate member (second substrate member) and was annealed for 5 minutes at 1180° C., whereby strong bonding was obtained.

The bonded substrate members were separated by the application of an external force, whereby the separation took place at the epitaxial Si/Ge interface.

It is already known that defects are introduced into the interface due to a difference in a lattice constant between Si and Ge. Also, if either layer is ultra thin, the defects tend to be introduced into such an ultra thin film. Accordingly, in the present example, the defects are introduced into the Ge film. Because of such a difference in the lattice constant and the introduction of defects, the Si/Ge interface becomes weaker and causes cleavage.

As a result, there could be obtained a single-crystal Si layer having a thickness of 0.5 μm, on the Si oxide film. The thickness of the single-crystal Si layer measured at 100 points over the entire region thereof exhibited a uniformity of 501±10 nm.

Further, a heat treatment was conducted for 1 hour at 1100° C. in hydrogen. The surface roughness evaluated thereafter by an atomic force microscope was about 0.2 nm in the root-mean-square in a region of 50 μm square and was equal to that of the commercially available Si wafer.

The cross-sectional observation by a transmission electron microscope confirmed that the epitaxially grown single-crystal Si layer did not exhibit generation of any new crystal defects but maintained excellent crystallinity.

The first substrate member was subjected to removal of the remaining Ge layer by surface polishing and could be used again as the first or the second substrate member.

EXAMPLE 7

The surface of a first single-crystal Si substrate member was anodized by immersion in HF solution under the following conditions.

Conditions for forming a first porous layer to be formed first:
current density: 1 mA·cm$^2$
anodizing solution: HF:H$_2$O:C$_2$H$_5$OH=1:1:1
time: 0.1 min
thickness of porous Si: 0.02 μm.

Conditions for forming a second porous layer:
current density: 50 mA·cm$^{-2}$
anodizing solution: HF:H$_2$O:C$_2$H$_5$OH=1:1:1
time: 5 sec
thickness of porous Si: 0.1 μm.

Conditions for forming a third porous layer:
current density: 7 mA·cm$^{-2}$
anodizing solution: HF:H$_2$O:C$_2$H$_5$OH=1:1:1 time: 1 min thickness of porous Si: 1 μm.

Under these anodizing conditions, the second porous Si layer formed with a current density of 50 mA·cm$^{-2}$ having a thickness thicker than the first porous layer exhibited the largest porosity and becomes a more structurally fragile layer.

The substrate member was then oxidized for 1 hour at 400° C. in an oxygen atmosphere, whereby the internal surface of the pores of the porous Si was covered with a thermal oxide film. The wafer as the substrate member was then placed in an epitaxy apparatus and was baked for 5 minutes at 1040° C. in a hydrogen atmosphere, whereby the pores on the surface side of the porous Si were filled. As a result, the outermost first porous Si layer formed with the current density of 1 mA·cm$^{-2}$ was made non-porous. Subsequently, on the layer made non-porous, single-crystal Si was epitaxially grown to a thickness of 0.3 μm by CVD, under the following growing conditions:

source gas: SiH$_2$Cl$_2$/H$_2$ gas flow rate: 0.5/180 l/min gas pressure: 80 Torr temperature: 950° C.

growth rate: 0.3 μm/min.

Then an SiO$_2$ layer having a thickness of 200 nm was formed by thermal oxidation in the surface region of the epitaxially grown Si layer.

A separate quartz substrate member (second substrate member) was surface-treated with N$_2$ plasma and rinsed with water. Then, the surface of the SiO$_2$ layer of the first substrate was superposed and brought into contact with the plasma-treated surface of the quartz substrate member, and heat treatment was conducted for 60 minutes at 400° C., whereby strong bonding was obtained.

The bonded substrate members were separated by the application of an external force, that is, by causing destruction of the layer having a larger porosity immediately under the non-porous Si layer to divide the two substrate members.

Since the first porous Si layer was made nonporous by baking in hydrogen prior to the epitaxial growth on the porous Si, the porous Si layer formed with the current density of 50 mA·cm$^{-2}$ and provided immediately under the non-porous Si became the layer having the highest porosity.

As a result, there could be obtained a non-porous single-crystal Si layer having a thickness of 0.2 μm on the Si oxide film of the second substrate member. Porous Si did not remain on the surface of the single-crystal Si layer. The thickness of the thus formed single-crystal Si layer measured at 100 points over the entire region thereof exhibited a uniformity of 201±4 nm.

Further, a heat treatment was conducted for 3 hours in hydrogen at a temperature of 1000° C. or lower. The surface roughness evaluated by an atomic force microscope was about 0.2 nm in the root-mean-square in a region of 50 μm square and was equal to that of the commercially available Si wafer.

The cross-sectional observation by a transmission electron microscope confirmed that the epitaxially grown single-crystal Si layer did not exhibit generation of any new crystal defects but maintained excellent crystallinity.

The first substrate member was subjected to selective etching with a mixture of 49% hydrofluoric acid and 30% hydrogen peroxide solution under agitation to remove the porous Si remaining on the first substrate member. Then, the first substrate member was subjected to annealing in a hydrogen atmosphere and could thereafter be used again as the first or the second substrate member. The third porous layer may also be omitted.

EXAMPLE 8

The surface of a first single-crystal Si substrate member was anodized by immersion in HF solution under the following conditions.

Conditions for forming a first porous layer to be formed first:

current density: 1 mA·cm$^{-2}$ anodizing solution: HF:H$_2$O:C$_2$H$_5$OH=1:1:1 time: 0.25 min thickness of porous Si: 0.05 μm.

Conditions for forming a second porous layer:

current density: 50 mA·cm$^{-2}$ anodizing solution: HF:H$_2$O:C$_2$H$_5$OH=1:1:1 time: 5 sec thickness of porous Si: 0.1 μm.

Conditions for forming a third porous layer to be formed last:

current density: 7 mA·cm$^{-2}$ anodizing solution: HF:H$_2$O:C$_2$H$_5$OH=1:1:1 time: 1 min thickness of porous Si: 1 μm.

Under these anodizing conditions, the second porous Si layer formed with a current density of 50 mA·cm$^{-2}$ became thicker than the first porous layer and exhibited the largest porosity, whereby the second porous Si layer became structurally fragile.

The substrate member was then oxidized for 1 hour at 400° C. in an oxygen atmosphere, whereby the internal surface of the pores of the porous Si was covered with a thermal oxide film. The wafer as the first substrate member was then placed in a hydrogen baking apparatus and was baked for 5 minutes at 1040° C. in a hydrogen atmosphere, whereby the pores on the surface side of the porous Si were filled. As a result, the outermost first porous Si layer formed with the current density of 1 mA·cm$^{-2}$ was made non-porous. The thus obtained non-porous layer was a single-crystal layer of excellent quality.

Then, without vapor epitaxial growth, an SiO$_2$ layer having a thickness of 20 nm was formed by thermal oxidation in the surface region of the epitaxially grown Si layer.

The surface of the SiO$_2$ layer was superposed and brought into contact with the surface of another Si substrate member (second substrate member) and heat treatment was conducted for 5 minutes at 1180° C., whereby strong bonding was obtained.

The bonded substrate members were separated by the application of an external force, that is, by causing destruction of the layer having the largest porosity to divide the two substrate members.

Heat treatment on the surface of porous Si has a function of moving Si atoms, thereby filling the pores on the surface side. Also H$_2$ removes the surface oxide film and prevents the regeneration thereof (N. Sato et al. J. Electrochem. Soc., Vol. 142, No. 9, 3116 (1996)). In the H$_2$ baking, the Si atoms constituting the first porous Si layer are consumed for filling the pores, whereby the second porous Si layer formed with the current density of 50 mA·cm$^{-2}$ and provided immediately under the outermost layer of non-porous single-crystal Si exhibited the highest porosity.

As a result, there could be obtained a single-crystal Si layer having a thickness of 40 nm on the Si oxide film of the second substrate member. The thickness of the thus formed single-crystal Si layer measured at 100 points over the entire region thereof exhibited a uniformity of 40±0.8 nm.

Further, a heat treatment was conducted for 1 hour in hydrogen at 1000° C. The surface roughness evaluated by an atomic force microscope was about 0.2 nm in the root-mean-square in a region of 50 μm square and was equal to that of the commercially available Si wafer.

The cross-sectional observation by a transmission electron microscope confirmed that the epitaxially grown single-crystal Si layer did not exhibit generation of any new crystal defects but maintained excellent crystallinity.

The first substrate member was subjected to selective etching with in a mixture of 49% hydrofluoric acid and 30% hydrogen peroxide under agitation to remove the porous Si remaining thereon. Then, the first substrate was subjected to annealing in a hydrogen atmosphere and could thereafter be used again as the first or the second substrate member. The third porous layer may also be omitted.

EXAMPLE 9

The surface of a first single-crystal Si substrate was anodized by immersion in HF solution under the following conditions, thereby making the surface porous:
current density: 1 mA·cm$^{-2}$
anodizing solution: HF:H$_2$O:C$_2$H$_5$OH=1:1:1
time: 0.5 min
thickness of porous Si: 0.1 μm.

The substrate member was then oxidized for 1 hour at 400° C. in an oxygen atmosphere, whereby the internal surface of the pores of the porous Si was covered with a thermal oxide film. The wafer as the first substrate member was then placed in an epitaxy apparatus and was baked for 5 minutes at 1040° C. in a hydrogen atmosphere, whereby the pores on the surface side of the porous Si were filled. Subsequently, single-crystal silicon was epitaxially grown to a thickness of 0.3 μm by CVD on the thus formed porous Si under the following growing conditions:
source gas: SiH$_2$Cl$_2$/H$_2$
gas flow rate: 0.5/180 l/min
gas pressure: 80 Torr
temperature: 950° C.
growth rate: 0.3 μm/min.

Then an SiO$_2$ layer having a thickness of 200 nm was formed by thermal oxidation in the surface region of the epitaxially grown Si layer.

The surface of the SiO$_2$ layer was superposed and brought into contact with the surface of another Si substrate member (second substrate member) and was annealed for 5 minutes at 1180° C., whereby strong bonding was obtained.

The bonded substrate members were separated by the application of an external force to divide them by the thin porous layer.

As a result, there could be obtained a single-crystal Si layer having a thickness of 0.2 μm on the Si oxide film of the second substrate member. The porous layer which remained without being made nonporous did not remain as a layer after the separation but only remained as surface roughness on the single-crystal Si layer. The thickness of the thus formed single-crystal Si layer measured at 100 points over the entire region thereof exhibited a uniformity of 201±4 nm.

For applications very sensitive to the surface property, such as production of a thin film transistor, a heat treatment was further conducted for 1 hour at 1100° C. in a hydrogen atmosphere. The surface roughness evaluated by an atomic force microscope was about 0.2 nm in the root-mean-square in a region of 50 μm square and was equal to that of the commercially available Si wafer.

The cross-sectional observation by a transmission electron microscope confirmed that the epitaxially grown single-crystal Si layer did not exhibit generation of any new crystal defects but maintained excellent crystallinity.

The first substrate member with surface roughness was subjected to surface smoothing treatment by hydrogen annealing without etching or polishing and could thereafter be used again as the first or the second substrate.

EXAMPLE 10

The surface of a first single-crystal Si substrate member was anodized by immersion in HF solution under the following conditions, thereby making the surface porous:
current density: 1 mA·cm$^{-2}$
anodizing solution: HF: H$_2$O: C$_2$H$_5$OH=1:1:1
time: 1 min
thickness of porous Si: 0.2 μm.

The substrate member was then placed in an epitaxy apparatus without oxidation of the internal surface of the pores in the porous layer and was baked for 5 minutes at 1040° C. in a hydrogen atmosphere, whereby the pores on the surface side of the porous Si were filled.

Subsequently, single-crystal Si was epitaxially grown to a thickness of 0.3 μm by CVD under the following growing conditions on the thus formed porous Si:
source gas: SiH$_2$Cl$_2$/H$_2$
gas flow rate: 0.5/180 l/min
gas pressure: 80 Torr
temperature: 950° C.
growth rate: 0.3 μm/min.

Then an SiO$_2$ layer having a thickness of 200 nm was formed by thermal oxidation in the surface region of the epitaxially grown Si layer.

The surface of the SiO$_2$ layer was superposed and brought into contact with the surface of another Si substrate member (second substrate member) and was annealed for 5 minutes at 1180° C., whereby strong bonding was obtained.

The bonded substrate members were separated by the application of an external force to divide them by the thin portion of the porous layer which remained without being converted into the non-porous state.

As a result, there could be obtained a single-crystal Si layer having a thickness of 0.2 μm on the Si oxide film. Since the internal wall of the pores of the porous Si was not oxidized prior to the epitaxial growth, the porous Si immediately under the epitaxial layer became fragile. Also, since the porous layer which became fragile was very thin, it did not remain as a layer after the separation but only remained as surface roughness on the single-crystal Si layer. The thickness of the thus formed single-crystal Si layer measured at 100 points over the entire region thereof exhibited a uniformity of 201±4 nm.

Further, a heat treatment was conducted for 1 hour at 1100° C. in a hydrogen atmosphere. The surface roughness evaluated by an atomic force microscope was about 0.2 nm in the root-mean-square in a region of 50 μm square and was equal to that of the commercially available Si wafer.

The cross-sectional observation by a transmission electron microscope confirmed that the epitaxially grown single-crystal Si layer did not exhibit generation of any new crystal defects and maintained excellent crystallinity.

The surface roughness on the first substrate member was removed by slight surface etching with a mixture of 49% hydrofluoric acid and 30% hydrogen peroxide solution. The first substrate was then subjected to hydrogen annealing and could thereafter be used again as the first or second substrate member.

EXAMPLE 11

The surface of a first substrate member consisting of a single-crystal Si wafer was anodized by immersion in HF solution under the following conditions, thereby making the surface porous.

Conditions for bonding a first porous layer to be formed first:

current density: 1 mA·cm$^{-2}$ anodizing solution: $HF:H_2O:C_2H_5OH=1:1:1$ time: 0.1 min thickness of porous Si: 0.02 μm.

Conditions for forming a second porous layer to be formed next:

current density: 50 mA·cm$^{-2}$ anodizing solution: $HF:H_2O:C_2H_5OH=1:1:1$ time: 5 sec thickness of porous Si: 0.1 μm.

Under these anodizing conditions, the second porous Si layer formed with a current density of 50 mA·cm$^{-2}$ became thicker than the first porous layer and exhibited a larger porosity, thereby becoming structurally fragile.

The substrate member was then oxidized for 1 hour at 400° C. in an oxygen atmosphere, whereby the internal surface of the pores of the porous Si was covered with a thermal oxide film. The wafer was then placed in an epitaxy apparatus and was baked for 5 minutes at 1040° C. in a hydrogen atmosphere, whereby the first porous layer was converted to a non-porous single-crystal Si layer. The second porous layer was provided immediately under the non-porous single-crystal Si layer.

Subsequently, single-crystal Si was epitaxially grown to a thickness of 0.3 μm by CVD under the following growing conditions on the thus formed non-porous Si:

source gas: $SiH_2Cl_2/H_2$ gas flow rate: 0.5/180 l/min gas pressure: 80 Torr temperature: 950° C.

growth rate: 0.3 μm/min.

Then an $SiO_2$ layer having a thickness of 20 nm was formed by thermal oxidation in the surface region of the epitaxially grown Si layer.

Separately, a single-crystal Si wafer was prepared as the second substrate member.

The surface of the $SiO_2$ layer on the first substrate was superposed and brought into contact with the Si surface of the second substrate member, and annealing was conducted for 5 minutes at 1180° C., whereby strong bonding was obtained.

The bonded wafers as a composite member consisting of the bonded two substrate members were separated by the application of an external force to divide them by the second porous layer having a higher porosity.

As explained in the foregoing, baking in hydrogen prior to the epitaxial growth causes migration of atoms constituting the first porous Si to fill the pores, thereby forming a non-porous layer which is integrated with the epitaxial layer to form a nonporous single-crystal Si layer.

As a result, there could be obtained a single-crystal Si layer having a thickness of 0.2 μm on the Si oxide film. The thickness of the thus formed single-crystal Si layer measured at 100 points over the entire region thereof exhibited a uniformity of 201±4 nm. Since the surface of the non-porous single-crystal Si layer on the second substrate member was rough, a heat treatment was conducted for 1 hour in hydrogen, at 1100° C. The surface roughness evaluated by an atomic force microscope was about 0.2 nm in the root-mean-square in a region of 50 μm square.

The surface roughness remaining on the first substrate member was removed by selective etching in a mixture of 49% hydrofluoric acid and 30% hydrogen peroxide solution under agitation. The first substrate member was then subjected to annealing in a hydrogen atmosphere and could thereafter be reused as the first or the second substrate member.

In each of the above examples, two SOI substrates can be simultaneously produced using one first substrate member, forming the aforementioned layers on both surfaces of the first substrate member, and bonding two second substrate members to both surfaces and separating two second substrate members from the bonded members.

In the above examples, polishing, heat treatment or etching is employed in order to remove the porous Si layer remaining on the first substrate member after the separation of the bonded substrate members. In case of etching, the following selective etching liquids may be employed as an etchant:

hydrofluoric acid;

hydrofluoric acid+hydrogen peroxide solution;

hydrofluoric acid+alcohol;

hydrofluoric acid+alcohol+hydrogen peroxide solution;

buffered hydrofluoric acid;

buffered hydrofluoric acid+hydrogen peroxide solution;

buffered hydrofluoric acid+alcohol;

buffered hydrofluoric acid+alcohol+hydrogen peroxide solution.

Also, even when a general Si etching liquid is used, selective etching can be achieved to a certain extent by the very large surface area of porous Si.

As explained in the foregoing, since according to the present invention, the remaining layer on the separated surface of the second substrate member is substantially absent, the selective etching or selective polishing of the separated surface can be omitted and the substrate can be produced inexpensively.

What is claimed is:

1. A method of producing a substrate, which comprises the steps of:

preparing a first substrate member having a first layer and a second layer provided on and adjacent to the first layer, bonding the first substrate member to a second substrate member, separating the first substrate member and the second substrate member to transfer the second layer onto the second substrate member, heat-treating the second layer transferred onto the second substrate member in a non-oxidative atmosphere, wherein the separation of the first substrate member and the second substrate member is conducted by an interface of the first layer and the second layer.

2. The method according to claim 1, wherein after forming a porous region on the surface of the first substrate member, a surface side portion of a surface portion of the porous region is made non-porous to form the second layer in non-porous state and the first layer in porous state.

3. The method according to claim 1, wherein a surface of the second layer exposed by the separation of the first layer is smoothed by a heat treatment in a non-oxidative atmosphere, without employing selective etching or selective polishing.

4. The method according to claim 1, wherein a first porous layer and a second porous layer of a higher porosity than that of the first porous layer are formed on the surface of the first substrate member, and the first porous layer is made non-porous to form the second layer in non-porous state so that the second layer is formed on and adjacent to the second porous layer.

5. The method according to claim 1, wherein a porous layer is formed on the surface of the first substrate, and the second layer comprising a non-porous layer is formed by epitaxial growth, without oxidation of wall surfaces of pores of the porous layer.

6. The method according to claim 1, wherein ion implantation is conducted at an interface of the first layer and the second layer.

7. The method according to claim 1, wherein a porous layer is formed on a surface of the first substrate member and then wall surfaces of pores of the porous layer are oxidized, and an oxide film on the surface side of the porous layer is removed and then the surface side of the porous layer is subjected to a heat treatment in a non-oxidative atmosphere.

8. The method according to claim 1, wherein a first porous layer, a second porous layer having a higher porosity than that of the first porous layer, and a third porous layer having a lower porosity than that of the second porous layer are formed on the surface of the first substrate member, and the first porous layer is made non-porous, the second porous layer being adjacent to the layer made non-porous.

9. The method according to claim 8, wherein after making the first porous layer non-porous, epitaxial growth is conducted.

10. The method according to claim 1, wherein a porous layer is formed on a surface of the first substrate member and wall surfaces of pores of the porous layer are oxidized, and the porous layer having oxidized walls of the pores is subjected to a heat treatment in a reducing atmosphere.

11. The method according to claim 10, wherein epitaxial growth is conducted on a surface made nonporous by the heat treatment.

12. The method according to claim 1, wherein after forming a porous layer on a surface of the first substrate member, without oxidizing the porous layer, the porous layer is subjected to a heat treatment in a non-oxidative atmosphere to make a surface of the porous layer non-porous, and epitaxial growth is conducted on the surface made non-porous.

13. The method according to claim 1, wherein the first substrate member comprises silicon.

14. The method according to claim 1, wherein the first layer comprises a porous material.

15. The method according to claim 1, wherein the second layer comprises a non-porous material.

16. The method according to claim 1, wherein the second layer comprises a non-porous semiconductor layer and an oxide layer provided thereon.

17. The method according to claim 1, wherein the second layer comprises a plurality of layers being different in conductive type or in impurity concentration.

18. The method according to claim 1, wherein prior to the formation of the second layer, wall surfaces of pores in a porous layer of the first layer are oxidized at a low temperature and an oxide film on the wall surfaces in a vicinity of a surface of the porous layer is removed.

19. The method according to claim 1, wherein the second layer comprises a layer formed by making nonporous at least a surface side portion of a porous layer by a heat treatment, and an oxide film formed on a surface of the layer made non-porous.

20. The method according to claim 19, wherein the heat treatment is conducted in hydrogen.

21. The method according to claim 1, wherein the first substrate after separation is reused.

22. The method according to claim 1, wherein the separation is conducted by pressure, traction, shear, wedge insertion, heat treatment, oxidation, vibration application or wire cutting.

23. The method according to claim 1, wherein at least a surface to be bonded of the second substrate comprises silicon oxide or silicon.

24. The method according to claim 1, wherein the second substrate member comprises a light-transmissive member.

25. The method according to claim 4, wherein a thickness of the first porous layer is smaller than that of the second porous layer.

26. A substrate produced by the method of claim 1.

27. A method of producing a semiconductor substrate, which comprises the steps of:

(a) preparing a first substrate comprising a nonporous single-crystalline layer on a porous layer:

(b) bonding the first substrate to a second substrate such that the non-porous single-crystalline layer is positioned inside bonded substrates to form a composite structure;

(c) separating the composite structure at an interface between the porous layer and the non-porous single-crystalline layer to transfer the non-porous single-crystalline layer onto the second substrate; and (d) subjecting the non-porous single-crystalline layer to a heat treatment in a non-oxidizing atmosphere.

28. The method according to claim 27, wherein the non-oxidizing atmosphere is a reducing atmosphere containing hydrogen.

29. The method according to claim 27, wherein the step of forming the composite structure is conducted by bonding the first substrate to the second substrate via an insulating layer.

30. The method according to claim 29, wherein the insulating layer is formed by oxidizing a surface of the non-porous single-crystalline layer.

31. The method according to claim 29, wherein the insulating layer is an insulating layer formed on the second substrate.

32. The method according to claim 27, wherein the non-porous single-crystalline layer is a single-crystalline silicon layer.

33. The method according to claim 29, wherein the porous layer is formed by anodizing single-crystalline silicon.

34. The method according to claim 27, wherein the separating step (c) is conducted to leave no residue on a surface of the non-porous single-crystalline layer after the transfer onto the second substrate.

* * * * *

UNITED STATES PATENT AND TRADEMARK OFFICE
CERTIFICATE OF CORRECTION

PATENT NO.    : 6,221,738 B1
DATED         : April 24, 2001
INVENTOR(S)   : Kiyofumi Sakaguchi et al.

It is certified that error appears in the above-identified patent and that said Letters Patent is hereby corrected as shown below:

Title page,
Item [56] References Cited, under OTHER PUBLICATIONS:

"Milnes et al." should read -- Milnes et al., --;
"It's Appli-" should read -- Its Appli- --; and
"Phys. soc.," should read -- Phys. Soc., --.

Column 1,
Line 46, "cost" should read -- cost, --.

Column 2,
Line 48, "called" should read -- called a --.

Column 4,
Line 4, "tends" should read -- tends to --; and
Line 60, "according" should read -- according to --.

Column 5,
Line 6, "has" should read -- have --; and
Line 37, "direction of," should read -- direction, --.

Column 6,
Line 33, "or applying" should read -- or ¶applying --.

Column 10,
Line 9, "causes the" should read -- causes --.

Column 11,
Line 9, "the whole" should read -- all the --.

Column 12,
Line 58, "or" should read -- of --.

Column 21,
Line 6, "becomes" should read -- became --; and
Line 40, "nonporous" should read -- non-porous --.

Column 22,
Line 56, "et al." should read -- et al., --.

UNITED STATES PATENT AND TRADEMARK OFFICE
CERTIFICATE OF CORRECTION

PATENT NO.    : 6,221,738 B1
DATED         : April 24, 2001
INVENTOR(S)   : Kiyofumi Sakaguchi et al.

It is certified that error appears in the above-identified patent and that said Letters Patent is hereby corrected as shown below:

Column 23,
Line 11, "in" should be deleted.

Column 24,
Line 21, close up right margin; and
Line 22, close up left margin.

Column 27,
Line 17, "wherein a" should read -- wherein ¶a --.

Signed and Sealed this

Twenty-sixth Day of March, 2002

Attest:

JAMES E. ROGAN
*Attesting Officer*   *Director of the United States Patent and Trademark Office*